United States Patent [19]

Anderson et al.

[11] Patent Number: 4,646,356
[45] Date of Patent: Feb. 24, 1987

[54] METHOD FOR CONVERTING A BIT MAP OF AN IMAGE TO A RUN LENGTH OR RUN END REPRESENTATION

[75] Inventors: Karen L. Anderson, Peekskill; Joan L. Mitchell, Ossining; William B. Pennebaker, Carmel; Gerald Goertzel, White Plains, all of N.Y.

[73] Assignee: International Business Machines Corporation, Armonk, N.Y.

[21] Appl. No.: 626,494

[22] Filed: Jun. 29, 1984

[51] Int. Cl.$^4$ .............................................. G06K 9/36
[52] U.S. Cl. ...................................... 382/56; 358/260; 358/261
[58] Field of Search .................. 382/56; 358/260, 261, 358/262

[56] References Cited

U.S. PATENT DOCUMENTS

| | | | |
|---|---|---|---|
| 3,739,085 | 6/1973 | Rosen et al. | 382/56 |
| 4,121,259 | 10/1978 | Preuss et al. | 358/261 |
| 4,555,802 | 11/1985 | Fedak et al. | 382/56 |
| 4,610,027 | 9/1986 | Anderson et al. | 358/260 |

Primary Examiner—David K. Moore
Assistant Examiner—Jacqueline Todd
Attorney, Agent, or Firm—George E. Clark; Terry J. Ilardi

[57] ABSTRACT

A method for converting an image from a bit map to a run end or run length representation includes the steps of: storing the image as a bit map representation; accessing for each byte in an image by a look-up table a selected routine, corresponding to such byte, from a number of routines for converting bit strings to run representations, wherein the look-up table accessed is selected in accordance with a color value of a preceding pixel binary bit; and executing the selected routine on the current byte to convert the bit string to a run representation; storing in a run representation buffer, as a count value, each run representation; repeating the above steps of accessing and executing for each byte and storing for each run of continuous color to the end of the image.

10 Claims, 4 Drawing Figures

LOOKUP TABLE FOR IMAGE BYTES
(PREVIOUS BIT WHITE)

| | | |
|---|---|---|
| 00 | W00000000 | → ROUTINE TO SCAN WHITE BYTES |
| 01 | W00000001 | → ROUTINE TO CONVERT '00000001' PATTERN |
| 02 | W00000010 | → ROUTINE TO CONVERT '00000010' PATTERN |
| 03 | W00000011 | → ROUTINE TO CONVERT '00000011' PATTERN |
| 04 | W00000100 | → ROUTINE TO CONVERT '00000100' PATTERN |
| 05 | W0 | → TRELLIS ROUTINE (WHITE ENTRY) |
| 06 | W00000110 | → ROUTINE TO CONVERT '00000110' PATTERN |
| ⋮ | ⋮ | ⋮ |
| F9 | W11111001 | → ROUTINE TO CONVERT '11111001' PATTERN |
| FA | W0 | → TRELLIS ROUTINE (WHITE ENTRY) |
| FB | W11111011 | → ROUTINE TO CONVERT '11111011' PATTERN |
| FC | W11111100 | → ROUTINE TO CONVERT '11111100' PATTERN |
| FD | W11111101 | → ROUTINE TO CONVERT '11111101' PATTERN |
| FE | W11111110 | → ROUTINE TO CONVERT '11111110' PATTERN |
| FF | W11111111 | → ROUTINE TO SCAN BLACK BYTES |

IMAGE BYTE →

FIG.1.1  LOOKUP TABLE FOR IMAGE BYTES
(PREVIOUS BIT WHITE)

FIG.1.2  LOOKUP TABLE FOR IMAGE BYTES
(PREVIOUS BIT BLACK)

FIG.2 EXPLICIT CODING TO CONVERT FOUR BYTES

FIG.3 TRELLIS PROCEDURE

METHOD FOR CONVERTING A BIT MAP OF AN IMAGE TO A RUN LENGTH OR RUN END REPRESENTATION

BACKGROUND OF THE INVENTION

1. Field of the Invention

The present invention relates to digital image processing methods and more particularly to methods for converting an image from a bit map representation to a run end or run length representation.

2. Description of the Prior Art

The following is a system representative of the prior art.

"A Method for Converting a Bit Map of an Image to a Run Length or Run End Representation", U.S. Pat. No. 4,610,027 to Anderson et al, shows a method for converting a bit map representation of an image to a run representation of an image, the method to be executed on a computer system which has the facility to perform shift operations and table look-ups in a relatively short time with relatively few machine cycles.

The method of the present invention is a modification and an improvement upon the prior art for execution on small systems, efficiently using the capabilities of small processors to convert images from bit map representations to run representations.

The prior art discussed above does not teach nor suggest the present invention as disclosed and claimed herein.

SUMMARY OF THE INVENTION

Therefore, it is an object of the present invention to convert an image from a bit map representation to a run end or run length representation by a method including the steps of: accessing for each byte in an image by a lookup table a selected routine, corresponding to such byte, from a number of routines for converting bit strings to run representations; executing the selected routine on the current byte to convert the bit string to a run representation; storing, in a run representation buffer, as a count value, each run representation; and repeating the steps of accessing and executing for each byte and storing for each run of continuous color to the end of the image.

It is another object of the present invention to convert an image bit map to a run end or run length representation by a method as above wherein the step of accessing further includes the step of: addressing a first lookup table with a current image byte if a last image bit has a first value; and addressing a second lookup table with a current image byte if a last image bit has a second value.

It is yet another object of the present invention to convert an image bit map to a run end or run length representation by a method as above wherein image bytes having more than a predetermined number of runs are converted to run representations by a bit by bit trellis routine.

It is yet another object of the present invention to convert an image bit map to a run end or run length representation by a method as above wherein image bytes having more than a predetermined number of runs are converted further including the step of: inputting a current image byte to a first starting point in a trellis routine if a last image bit is a first color; and inputting a current image byte to a second starting point in a trellis routine if a last image bit is a second color.

Accordingly, a method for converting an image from a bit map to a run end or run length representation includes the steps of: storing the image as a bit map representation; accessing for each byte in an image by a look-up table a selected routine, corresponding to such byte, from a number of routines for converting bit strings to run representations, wherein the look-up table accessed is selected in accordance with a color value of a preceding pixel binary bit; executing the selected routine or the current byte to convert the bit string to a run representation; storing in a run representation buffer, as a count value, each run representation; and repeating the above steps of accessing and executing for each byte and storing for each run of continuous color to the end of the image.

It has been determined that in a typical image approximately 98% of image bytes have three or fewer runs and that this 98% of the image bytes include 60 byte patterns which may be preceded by a white bit or by a black bit requiring 120 table entry points plus one table entry point for an end of line code for a total of 121 entry points. This 98% is processed from bit string representation to run representation in an efficient and fast manner in accordance with the present invention. The remaining 2% of the image bytes which have four or more runs therein are processed by a trellis routine having a first entry point for bytes with a previous white bit and a second entry point for bytes with a previous black bit.

It should be noted that each of the image bytes having three or fewer runs has a unique routine for processing the bit string to a run representation whereas the remaining image bytes having four or more runs are all processed by a common routine which differs only in the entry point determined by the color or a previous bit in the image.

It is a feature of the present invention that image data may be rapidly converted from bit string representation to run representation in a small processor such as a microcomputer by a method as above which takes maximum advantage of the processor capabilities of a microcomputer to speed execution of the conversion of an image from bit strings to run representations.

The foregoing and other objects, features and advantages of the invention will be apparent from the more particular description of the preferred embodiments of the invention, as illustrated in the accompanying drawing.

BRIEF DESCRIPTION OF THE DRAWING

FIG. 1.1 is a schematic diagram of the first step in the method according to the present invention for processing an image byte following a white bit.

FIG. 1.2 is a schematic diagram of the first step in the method according to the present invention for processing an image byte following a black bit.

In the drawing, like elements are designated with similar reference numbers, and identical elements in different specific embodiments are designated by identical reference numbers.

DESCRIPTION OF A PREFERRED EMBODIMENT OF THE INVENTION

The method according to the present invention addresses the problem of using an IBM Personal Computer to quickly convert a binary image represented as a bit map (8 bits/byte) in storage into a series of vectors of run ends or run lengths (one vector for each line of image data and each vector containing one or more run end or length representations). The run ends are the displacements in bits (i.e. picture elements or pels) from the left edge of the image to the last pel in each run.

The present method uses a novel combination of techniques to produce code which is significantly faster than prior art methods. These include:
1. Using a lookup table to locate the code for processing any image byte, implicitly selecting which of a number of routines is most appropriate for processing that byte's bit pattern;
2. Explicitly coding the steps to be followed to process the bytes which occur most frequently in typical images;
3. Applying a more general (but still reasonably fast) routine to process most other possible image bytes;
4. Forcing processing at the right edge of the line into a rarely used path to avoid frequent testing for the end of a line of image data; and
5. Exploiting the fact that a binary image typically includes large areas containing only zero (white) picture elements.

The prior art describes the fifth technique (which uses the scanning instruction available on many processors to find the length of a long sequence of zero bytes relatively quickly), an alternative method of applying the fourth technique, and the procedures which control the conversion (trimming, padding, etc.).

In the IBM System/370 the ratio of the execution time of a branch to that of a lookup is approximately $2\frac{1}{2}$ to 1 and the ratio of a branch to any shift is approximately 4 to 1. In an IBM Personal Computer the cost of a lookup is slightly higher than the cost of a branch, and a shift by a variable number of bits costs $\frac{3}{4}$ of a branch for a shift by 1 bit, 1 branch for a shift by 2 bits, $1\frac{1}{4}$ branches for a shift by three bits, etc. It is therefore much more important in an IBM Personal Computer to minimize lookups and variable shifts, even at the cost of requiring more code space. It is also advantageous to make use of the operations which an IBM Personal Computer can perform very quickly, such as shifts by a single bit ($\frac{1}{8}$ of a branch) and additions of constant values to registers ($\frac{1}{4}$ of a branch). The method described herein is designed to avoid extensive use of instructions which are very time-consuming to execute on an IBM Personal Computer.

The preferred embodiment of the present invention generates a run end representation of the image data. It could be adapted to produce a run length representation if required.

The preferred embodiment creates a run end buffer for each line which contains a series of halfwords. The 16 bits in the halfword are adequate to represent images with widths up to 32K as positive displacements. The first halfword in each line buffer gives the number of bytes of run end data plus two bytes for the count (i.e. the total number of bytes of data in the buffer); this is followed by three zero run ends, an arbitrary number of pairs of white/black run ends, and two additional copies of the last black run end. If the image row begins with a black run, the first white run end must be specified as zero. If the image row ends with a white run, the last black run end will be the same as the last white run end, so that we in fact have three additional copies of the last real run end. For example, if no skipping or padding is specified, the three-line bit image in which a black bit is represented by a binary 11 and a white bit is represented by a binary 0:

| | | | |
|---|---|---|---|
| 11111111 | 11000000 | 00000000 | 00010000 |
| 00000000 | 00000000 | 00000000 | 00000000 |
| 10100000 | 10001111 | 11111111 | 11110001 | would produce three vectors with the following halfword entries:

| | | | | | | | | | | | |
|---|---|---|---|---|---|---|---|---|---|---|---|
| 24 | 0 | 0 | 0 | 0 | 10 | 27 | 28 | 32 | 32 | 32 | 32 |
| 16 | 0 | 0 | 0 | 32 | 32 | 32 | 32 | | | | |
| 32 | 0 | 0 | 0 | 0 | 1 | 2 | 3 | 8 | 9 | 12 | 28 | 31 | 32 | 32 | 32 |

Figure 11:
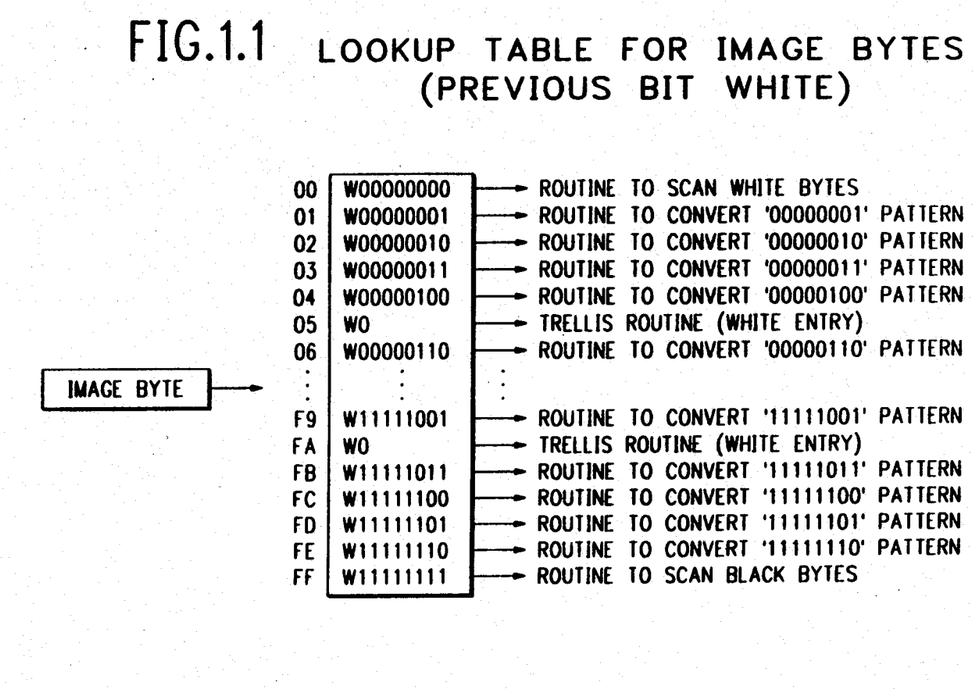
Figure 12:
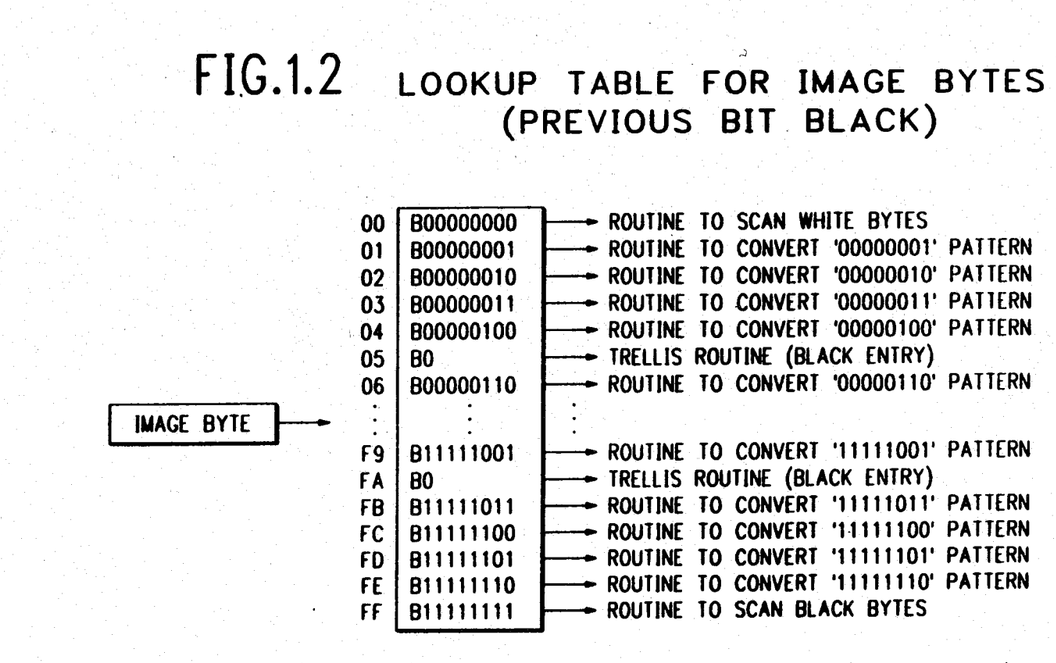

The conversion method according to the present invention (see FIGS. 1.1 and 1.2) operates by reading a byte of image data, using it to index into one of two lookup tables (see Tables I and II below) to obtain the address of the routine which is to be used to process the byte, and then branching to that address. There are two tables because the bit preceding the byte being processed may be either white (0) or black (1); if the first bit of the new byte is not the same color as the preceding bit, then the first bit begins a new run and the current run end must be saved before processing the byte.

TABLE 1

| | previous bit white (WTBL) | | |
|---|---|---|---|
| BYTE | LABEL | ROUTINE | PATTERN |
| 00000000 | W00000000 | Routine to scan white bytes | |
| 00000001 | W00000001 | Routine to process '00000001' | |
| 00000010 | W00000010 | Routine to process '00000010' | |
| 00000011 | W00000011 | Routine to process '00000011' | |
| 00000100 | W00000100 | Routine to process '00000100' | |
| 00000101 | W0 | Trellis routine (white entry) | |
| 00000110 | W00000110 | Routine to process '00000110' | |
| 00000111 | W00000111 | Routine to process '00000111' | |
| 00001000 | W00001000 | Routine to process '00001000' | |
| 00001001 | W0 | Trellis routine (white entry) | |
| 00001010 | W0 | Trellis routine (white entry) | |
| 00001011 | W0 | Trellis routine (white entry) | |
| 00001100 | W00001100 | Routine to process '00001100' | |
| 00001101 | W0 | Trellis routine (white entry) | |
| 00001110 | W00001110 | Routine to process '00001110' | |
| 00001111 | W00001111 | Routine to process '00001111' | |
| 00010000 | W00010000 | Routine to process '00010000' | |
| 00010001 | W0 | Trellis routine (white entry) | |
| 00010010 | W0 | Trellis routine (white entry) | |
| 00010011 | W0 | Trellis routine (white entry) | |
| 00010100 | W0 | Trellis routine (white entry) | |
| 00010101 | W0 | Trellis routine (white entry) | |
| 00010110 | W0 | Trellis routine (white entry) | |
| 00010111 | W0 | Trellis routine (white entry) | |
| 00011000 | W00011000 | Routine to process '00011000' | |
| 00011001 | W0 | Trellis routine (white entry) | |
| 00011010 | W0 | Trellis routine (white entry) | |
| 00011011 | W0 | Trellis routine (white entry) | |
| 00011100 | W00011100 | Routine to process '00011100' | |
| 00011101 | W0 | Trellis routine (white entry) | |
| 00011110 | W00011110 | Routine to process '00011110' | |
| 00011111 | W00011111 | Routine to process '00011111' | |
| 00100000 | W00100000 | Routine to process '00100000' | |
| 00100001 | W0 | Trellis routine (white entry) | |
| 00100010 | W0 | Trellis routine (white entry) | |
| 00100011 | W0 | Trellis routine (white entry) | |
| 00100100 | W0 | Trellis routine (white entry) | |
| 00100101 | W0 | Trellis routine (white entry) | |
| 00100110 | W0 | Trellis routine (white entry) | |

TABLE 1-continued previous bit white (WTBL)

| BYTE | LABEL | ROUTINE PATTERN |
|---|---|---|
| 00100111 | W0 | Trellis routine (white entry) |
| 00101000 | W0 | Trellis routine (white entry) |
| 00101001 | W0 | Trellis routine (white entry) |
| 00101010 | W0 | Trellis routine (white entry) |
| 00101011 | W0 | Trellis routine (white entry) |
| 00101100 | W0 | Trellis routine (white entry) |
| 00101101 | W0 | Trellis routine (white entry) |
| 00101110 | W0 | Trellis routine (white entry) |
| 00101111 | W0 | Trellis routine (white entry) |
| 00110000 | W00110000 | Routine to process '00110000' |
| 00110001 | W0 | Trellis routine (white entry) |
| 00110010 | W0 | Trellis routine (white entry) |
| 00110011 | W0 | Trellis routine (white entry) |
| 00110100 | W0 | Trellis routine (white entry) |
| 00110101 | W0 | Trellis routine (white entry) |
| 00110110 | W0 | Trellis routine (white entry) |
| 00110111 | W0 | Trellis routine (white entry) |
| 00111000 | W00111000 | Routine to process '00111000' |
| 00111001 | W0 | Trellis routine (white entry) |
| 00111010 | W0 | Trellis routine (white entry) |
| 00111011 | W0 | Trellis routine (white entry) |
| 00111100 | W00111100 | Routine to process '00111100' |
| 00111101 | W0 | Trellis routine (white entry) |
| 00111110 | W00111110 | Routine to process '00111110' |
| 00111111 | W00111111 | Routine to process '00111111' |
| 01000000 | W01000000 | Routine to process '01000000' |
| 01000001 | W0 | Trellis routine (white entry) |
| 01000010 | W0 | Trellis routine (white entry) |
| 01000011 | W0 | Trellis routine (white entry) |
| 01000100 | W0 | Trellis routine (white entry) |
| 01000101 | W0 | Trellis routine (white entry) |
| 01000110 | W0 | Trellis routine (white entry) |
| 01000111 | W0 | Trellis routine (white entry) |
| 01001000 | W0 | Trellis routine (white entry) |
| 01001001 | W0 | Trellis routine (white entry) |
| 01001010 | W0 | Trellis routine (white entry) |
| 01001011 | W0 | Trellis routine (white entry) |
| 01001100 | W0 | Trellis routine (white entry) |
| 01001101 | W0 | Trellis routine (white entry) |
| 01001110 | W0 | Trellis routine (white entry) |
| 01001111 | W0 | Trellis routine (white entry) |
| 01010000 | W0 | Trellis routine (white entry) |
| 01010001 | W0 | Trellis routine (white entry) |
| 01010010 | W0 | Trellis routine (white entry) |
| 01010011 | W0 | Trellis routine (white entry) |
| 01010100 | W0 | Trellis routine (white entry) |
| 01010101 | W0 | Trellis routine (white entry) |
| 01010110 | W0 | Trellis routine (white entry) |
| 01010111 | W0 | Trellis routine (white entry) |
| 01011000 | W0 | Trellis routine (white entry) |
| 01011001 | W0 | Trellis routine (white entry) |
| 01011010 | W0 | Trellis routine (white entry) |
| 01011011 | W0 | Trellis routine (white entry) |
| 01011100 | W0 | Trellis routine (white entry) |
| 01011101 | W0 | Trellis routine (white entry) |
| 01011110 | W0 | Trellis routine (white entry) |
| 01011111 | W0 | Trellis routine (white entry) |
| 01100000 | W01100000 | Routine to process '01100000' |
| 01100001 | W0 | Trellis routine (white entry) |
| 01100010 | W0 | Trellis routine (white entry) |
| 01100011 | W0 | Trellis routine (white entry) |
| 01100100 | W0 | Trellis routine (white entry) |
| 01100101 | W0 | Trellis routine (white entry) |
| 01100110 | W0 | Trellis routine (white entry) |
| 01100111 | W0 | Trellis routine (white entry) |
| 01101000 | W0 | Trellis routine (white entry) |
| 01101001 | W0 | Trellis routine (white entry) |
| 01101010 | W0 | Trellis routine (white entry) |
| 01101011 | W0 | Trellis routine (white entry) |
| 01101100 | W0 | Trellis routine (white entry) |
| 01101101 | W0 | Trellis routine (white entry) |
| 01101110 | W0 | Trellis routine (white entry) |
| 01101111 | W0 | Trellis routine (white entry) |
| 01110000 | W01110000 | Routine to process '01110000' |
| 01110001 | W0 | Trellis routine (white entry) |
| 01110010 | W0 | Trellis routine (white entry) |
| 01110011 | W0 | Trellis routine (white entry) |
| 01110100 | W0 | Trellis routine (white entry) |
| 01110101 | W0 | Trellis routine (white entry) |
| 01110110 | W0 | Trellis routine (white entry) |
| 01110111 | W0 | Trellis routine (white entry) |
| 01111000 | W01111000 | Routine to process '01111000' |
| 01111001 | W0 | Trellis routine (white entry) |
| 01111010 | W0 | Trellis routine (white entry) |
| 01111011 | W0 | Trellis routine (white entry) |
| 01111100 | W01111100 | Routine to process '01111100' |
| 01111101 | W0 | Trellis routine (white entry) |
| 01111110 | W01111110 | Routine to process '01111110' |
| 01111111 | W01111111 | Routine to process '01111111' |
| 10000000 | W10000000 | Routine to process '10000000' |
| 10000001 | W10000001 | Routine to process '10000001' |
| 10000010 | W0 | Trellis routine (white entry) |
| 10000011 | W10000011 | Routine to process '10000011' |
| 10000100 | W0 | Trellis routine (white entry) |
| 10000101 | W0 | Trellis routine (white entry) |
| 10000110 | W0 | Trellis routine (white entry) |
| 10000111 | W10000111 | Routine to process '10000111' |
| 10001000 | W0 | Trellis routine (white entry) |
| 10001001 | W0 | Trellis routine (white entry) |
| 10001010 | W0 | Trellis routine (white entry) |
| 10001011 | W0 | Trellis routine (white entry) |
| 10001100 | W0 | Trellis routine (white entry) |
| 10001101 | W0 | Trellis routine (white entry) |
| 10001110 | W0 | Trellis routine (white entry) |
| 10001111 | W10001111 | Routine to process '10001111' |
| 10010000 | W0 | Trellis routine (white entry) |
| 10010001 | W0 | Trellis routine (white entry) |
| 10010010 | W0 | Trellis routine (white entry) |
| 10010011 | W0 | Trellis routine (white entry) |
| 10010100 | W0 | Trellis routine (white entry) |
| 10010101 | W0 | Trellis routine (white entry) |
| 10010110 | W0 | Trellis routine (white entry) |
| 10010111 | W0 | Trellis routine (white entry) |
| 10011000 | W0 | Trellis routine (white entry) |
| 10011001 | W0 | Trellis routine (white entry) |
| 10011010 | W0 | Trellis routine (white entry) |
| 10011011 | W0 | Trellis routine (white entry) |
| 10011100 | W0 | Trellis routine (white entry) |
| 10011101 | W0 | Trellis routine (white entry) |
| 10011110 | W0 | Trellis routine (white entry) |
| 10011111 | W10011111 | Routine to process '10011111' |
| 10100000 | W0 | Trellis routine (white entry) |
| 10100001 | W0 | Trellis routine (white entry) |
| 10100010 | W0 | Trellis routine (white entry) |
| 10100011 | W0 | Trellis routine (white entry) |
| 10100100 | W0 | Trellis routine (white entry) |
| 10100101 | W0 | Trellis routine (white entry) |
| 10100110 | W0 | Trellis routine (white entry) |
| 10100111 | W0 | Trellis routine (white entry) |
| 10101000 | W0 | Trellis routine (white entry) |
| 10101001 | W0 | Trellis routine (white entry) |
| 10101010 | W0 | Trellis routine (white entry) |
| 10101011 | W0 | Trellis routine (white entry) |
| 10101100 | W0 | Trellis routine (white entry) |
| 10101101 | W0 | Trellis routine (white entry) |
| 10101110 | W0 | Trellis routine (white entry) |
| 10101111 | W0 | Trellis routine (white entry) |
| 10110000 | W0 | Trellis routine (white entry) |
| 10110001 | W0 | Trellis routine (white entry) |
| 10110010 | W0 | Trellis routine (white entry) |
| 10110011 | W0 | Trellis routine (white entry) |
| 10110100 | W0 | Trellis routine (white entry) |
| 10110101 | W0 | Trellis routine (white entry) |
| 10110110 | W0 | Trellis routine (white entry) |
| 10110111 | W0 | Trellis routine (white entry) |
| 10111000 | W0 | Trellis routine (white entry) |
| 10111001 | W0 | Trellis routine (white entry) |
| 10111010 | W0 | Trellis routine (white entry) |
| 10111011 | W0 | Trellis routine (white entry) |
| 10111100 | W0 | Trellis routine (white entry) |
| 10111101 | W0 | Trellis routine (white entry) |
| 10111110 | W0 | Trellis routine (white entry) |
| 10111111 | W10111111 | Routine to process '10111111' |
| 11000000 | W11000000 | Routine to process '11000000' |
| 11000001 | W11000001 | Routine to process '11000001' |
| 11000010 | W0 | Trellis routine (white entry) |
| 11000011 | W11000011 | Routine to process '11000011' |
| 11000100 | W0 | Trellis routine (white entry) |

TABLE 1-continued previous bit white (WTBL)

| BYTE | LABEL | ROUTINE PATTERN |
|---|---|---|
| 11000101 | W0 | Trellis routine (white entry) |
| 11000110 | W0 | Trellis routine (white entry) |
| 11000111 | W11000111 | Routine to process '11000111' |
| 11001000 | W0 | Trellis routine (white entry) |
| 11001001 | W0 | Trellis routine (white entry) |
| 11001010 | W0 | Trellis routine (white entry) |
| 11001011 | W0 | Trellis routine (white entry) |
| 11001100 | W0 | Trellis routine (white entry) |
| 11001101 | W0 | Trellis routine (white entry) |
| 11001110 | W0 | Trellis routine (white entry) |
| 11001111 | W11001111 | Routine to process '11001111' |
| 11010000 | W0 | Trellis routine (white entry) |
| 11010001 | W0 | Trellis routine (white entry) |
| 11010010 | W0 | Trellis routine (white entry) |
| 11010011 | W0 | Trellis routine (white entry) |
| 11010100 | W0 | Trellis routine (white entry) |
| 11010101 | W0 | Trellis routine (white entry) |
| 11010110 | W0 | Trellis routine (white entry) |
| 11010111 | W0 | Trellis routine (white entry) |
| 11011000 | W0 | Trellis routine (white entry) |
| 11011001 | W0 | Trellis routine (white entry) |
| 11011010 | W0 | Trellis routine (white entry) |
| 11011011 | W0 | Trellis routine (white entry) |
| 11011100 | W0 | Trellis routine (white entry) |
| 11011101 | W0 | Trellis routine (white entry) |
| 11011110 | W0 | Trellis routine (white entry) |
| 11011111 | W11011111 | Routine to process '11011111' |
| 11100000 | W11100000 | Routine to process '11100000' |
| 11100001 | W11100001 | Routine to process '11100001' |
| 11100010 | W0 | Trellis routine (white entry) |
| 11100011 | W11100011 | Routine to process '11100011' |
| 11100100 | W0 | Trellis routine (white entry) |
| 11100101 | W0 | Trellis routine (white entry) |
| 11100110 | W0 | Trellis routine (white entry) |
| 11100111 | W11100111 | Routine to process '11100111' |
| 11101000 | W0 | Trellis routine (white entry) |
| 11101001 | W0 | Trellis routine (white entry) |
| 11101010 | W0 | Trellis routine (white entry) |
| 11101011 | W0 | Trellis routine (white entry) |
| 11101100 | W0 | Trellis routine (white entry) |
| 11101101 | W0 | Trellis routine (white entry) |
| 11101110 | W0 | Trellis routine (white entry) |
| 11101111 | W11101111 | Routine to process '11101111' |
| 11110000 | W11110000 | Routine to process '11110000' |
| 11110001 | W11110001 | Routine to process '11110001' |
| 11110010 | W0 | Trellis routine (white entry) |
| 11110011 | W11110011 | Routine to process '11110011' |
| 11110100 | W0 | Trellis routine (white entry) |
| 11110101 | W0 | Trellis routine (white entry) |
| 11110110 | W0 | Trellis routine (white entry) |
| 11110111 | W11110111 | Routine to process '11110111' |
| 11111000 | W11111000 | Routine to process '11111000' |
| 11111001 | W11111001 | Routine to process '11111001' |
| 11111010 | W0 | Trellis routine (white entry) |
| 11111011 | W11111011 | Routine to process '11111011' |
| 11111100 | W11111100 | Routine to process '11111100' |
| 11111101 | W11111101 | Routine to process '11111101' |
| 11111110 | W11111110 | Routine to process '11111110' |
| 11111111 | W11111111 | Routine to scan black bytes |

TABLE II previous bit black (BTBL)

| | | |
|---|---|---|
| 00000000 | B00000000 | Routine to scan white bytes |
| 00000001 | B00000001 | Routine to process '00000001' |
| 00000010 | B00000010 | Routine to process '00000010' |
| 00000011 | B00000011 | Routine to process '00000011' |
| 00000100 | B00000100 | Routine to process '00000100' |
| 00000101 | B0 | Trellis routine (black entry) |
| 00000110 | B00000110 | Routine to process '00000110' |
| 00000111 | B00000111 | Routine to process '00000111' |
| 00001000 | B00001000 | Routine to process '00001000' |
| 00001001 | B0 | Trellis routine (black entry) |
| 00001010 | B0 | Trellis routine (black entry) |
| 00001011 | B0 | Trellis routine (black entry) |
| 00001100 | B00001100 | Routine to process '00001100' |
| 00001101 | B0 | Trellis routine (black entry) |
| 00001110 | B00001110 | Routine to process '00001110' |

TABLE II-continued previous bit black (BTBL)

| | | |
|---|---|---|
| 00001111 | B00001111 | Routine to process '00001111' |
| 00010000 | B00010000 | Routine to process '00010000' |
| 00010001 | B0 | Trellis routine (black entry) |
| 00010010 | B0 | Trellis routine (black entry) |
| 00010011 | B0 | Trellis routine (black entry) |
| 00010100 | B0 | Trellis routine (black entry) |
| 00010101 | B0 | Trellis routine (black entry) |
| 00010110 | B0 | Trellis routine (black entry) |
| 00010111 | B0 | Trellis routine (black entry) |
| 00011000 | B00011000 | Routine to process '00011000' |
| 00011001 | B0 | Trellis routine (black entry) |
| 00011010 | B0 | Trellis routine (black entry) |
| 00011011 | B0 | Trellis routine (black entry) |
| 00011100 | B00011100 | Routine to process '00011100' |
| 00011101 | B0 | Trellis routine (black entry) |
| 00011110 | B00011110 | Routine to process '00011110' |
| 00011111 | B00011111 | Routine to process '00011111' |
| 00100000 | B00100000 | Routine to process '00100000' |
| 00100001 | B0 | Trellis routine (black entry) |
| 00100010 | B0 | Trellis routine (black entry) |
| 00100011 | B0 | Trellis routine (black entry) |
| 00100100 | B0 | Trellis routine (black entry) |
| 00100101 | B0 | Trellis routine (black entry) |
| 00100110 | B0 | Trellis routine (black entry) |
| 00100111 | B0 | Trellis routine (black entry) |
| 00101000 | B0 | Trellis routine (black entry) |
| 00101001 | B0 | Trellis routine (black entry) |
| 00101010 | B0 | Trellis routine (black entry) |
| 00101011 | B0 | Trellis routine (black entry) |
| 00101100 | B0 | Trellis routine (black entry) |
| 00101101 | B0 | Trellis routine (black entry) |
| 00101110 | B0 | Trellis routine (black entry) |
| 00101111 | B0 | Trellis routine (black entry) |
| 00110000 | B00110000 | Routine to process '00110000' |
| 00110001 | B0 | Trellis routine (black entry) |
| 00110010 | B0 | Trellis routine (black entry) |
| 00110011 | B0 | Trellis routine (black entry) |
| 00110100 | B0 | Trellis routine (black entry) |
| 00110101 | B0 | Trellis routine (black entry) |
| 00110110 | B0 | Trellis routine (black entry) |
| 00110111 | B0 | Trellis routine (black entry) |
| 00111000 | B00111000 | Routine to process '00111000' |
| 00111001 | B0 | Trellis routine (black entry) |
| 00111010 | B0 | Trellis routine (black entry) |
| 00111011 | B0 | Trellis routine (black entry) |
| 00111100 | B00111100 | Routine to process '00111100' |
| 00111101 | B0 | Trellis routine (black entry) |
| 00111110 | B00111110 | Routine to process '00111110' |
| 00111111 | B00111111 | Routine to process '00111111' |
| 01000000 | B01000000 | Routine to process '01000000' |
| 01000001 | B0 | Trellis routine (black entry) |
| 01000010 | B0 | Trellis routine (black entry) |
| 01000011 | B0 | Trellis routine (black entry) |
| 01000100 | B0 | Trellis routine (black entry) |
| 01000101 | B0 | Trellis routine (black entry) |
| 01000110 | B0 | Trellis routine (black entry) |
| 01000111 | B0 | Trellis routine (black entry) |
| 01001000 | B0 | Trellis routine (black entry) |
| 01001001 | B0 | Trellis routine (black entry) |
| 01001010 | B0 | Trellis routine (black entry) |
| 01001011 | B0 | Trellis routine (black entry) |
| 01001100 | B0 | Trellis routine (black entry) |
| 01001101 | B0 | Trellis routine (black entry) |
| 01001110 | B0 | Trellis routine (black entry) |
| 01001111 | B0 | Trellis routine (black entry) |
| 01010000 | B0 | Trellis routine (black entry) |
| 01010001 | B0 | Trellis routine (black entry) |
| 01010010 | B0 | Trellis routine (black entry) |
| 01010011 | B0 | Trellis routine (black entry) |
| 01010100 | B0 | Trellis routine (black entry) |
| 01010101 | B0 | Trellis routine (black entry) |
| 01010110 | B0 | Trellis routine (black entry) |
| 01010111 | B0 | Trellis routine (black entry) |
| 01011000 | B0 | Trellis routine (black entry) |
| 01011001 | B0 | Trellis routine (black entry) |
| 01011010 | B0 | Trellis routine (black entry) |
| 01011011 | B0 | Trellis routine (black entry) |
| 01011100 | B0 | Trellis routine (black entry) |
| 01011101 | B0 | Trellis routine (black entry) |
| 01011110 | B0 | Trellis routine (black entry) |
| 01011111 | B0 | Trellis routine (black entry) |

TABLE II-continued
previous bit black (BTBL)

| | | |
|---|---|---|
| 01100000 | B01100000 | Routine to process '01100000' |
| 01100001 | B0 | Trellis routine (black entry) |
| 01100010 | B0 | Trellis routine (black entry) |
| 01100011 | B0 | Trellis routine (black entry) |
| 01100100 | B0 | Trellis routine (black entry) |
| 01100101 | B0 | Trellis routine (black entry) |
| 01100110 | B0 | Trellis routine (black entry) |
| 01100111 | B0 | Trellis routine (black entry) |
| 01101000 | B0 | Trellis routine (black entry) |
| 01101001 | B0 | Trellis routine (black entry) |
| 01101010 | B0 | Trellis routine (black entry) |
| 01101011 | B0 | Trellis routine (black entry) |
| 01101100 | B0 | Trellis routine (black entry) |
| 01101101 | B0 | Trellis routine (black entry) |
| 01101110 | B0 | Trellis routine (black entry) |
| 01101111 | B0 | Trellis routine (black entry) |
| 01110000 | B01110000 | Routine to process '01110000' |
| 01110001 | B0 | Trellis routine (black entry) |
| 01110010 | B0 | Trellis routine (black entry) |
| 01110011 | B0 | Trellis routine (black entry) |
| 01110100 | B0 | Trellis routine (black entry) |
| 01110101 | B0 | Trellis routine (black entry) |
| 01110110 | B0 | Trellis routine (black entry) |
| 01110111 | B0 | Trellis routine (black entry) |
| 01111000 | B01111000 | Routine to process '01111000' |
| 01111001 | B0 | Trellis routine (black entry) |
| 01111010 | B0 | Trellis routine (black entry) |
| 01111011 | B0 | Trellis routine (black entry) |
| 01111100 | B01111100 | Routine to process '01111100' |
| 01111101 | B0 | Trellis routine (black entry) |
| 01111110 | B01111110 | Routine to process '01111110' |
| 01111111 | B01111111 | Routine to process '01111111' |
| 10000000 | B10000000 | Routine to process '10000000' |
| 10000001 | B10000001 | Routine to process '10000001' |
| 10000010 | B0 | Trellis routine (black entry) |
| 10000011 | B10000011 | Routine to process '10000011' |
| 10000100 | B0 | Trellis routine (black entry) |
| 10000101 | B0 | Trellis routine (black entry) |
| 10000110 | B0 | Trellis routine (black entry) |
| 10000111 | B10000111 | Routine to process '10000111' |
| 10001000 | B0 | Trellis routine (black entry) |
| 10001001 | B0 | Trellis routine (black entry) |
| 10001010 | B0 | Trellis routine (black entry) |
| 10001011 | B0 | Trellis routine (black entry) |
| 10001101 | B0 | Trellis routine (black entry) |
| 10001110 | B0 | Trellis routine (black entry) |
| 10001111 | B10001111 | Routine to process '10001111' |
| 10010000 | B0 | Trellis routine (black entry) |
| 10010001 | B0 | Trellis routine (black entry) |
| 10010010 | B0 | Trellis routine (black entry) |
| 10010011 | B0 | Trellis routine (black entry) |
| 10010100 | B0 | Trellis routine (black entry) |
| 10010101 | B0 | Trellis routine (black entry) |
| 10010110 | B0 | Trellis routine (black entry) |
| 10010111 | B0 | Trellis routine (black entry) |
| 10011000 | B0 | Trellis routine (black entry) |
| 10011001 | B0 | Trellis routine (black entry) |
| 10011010 | B0 | Trellis routine (black entry) |
| 10011011 | B0 | Trellis routine (black entry) |
| 10011100 | B0 | Trellis routine (black entry) |
| 10011101 | B0 | Trellis routine (black entry) |
| 10011110 | B0 | Trellis routine (black entry) |
| 10011111 | B10011111 | Routine to process '10011111' |
| 10100000 | B0 | Trellis routine (black entry) |
| 10100001 | B0 | Trellis routine (black entry) |
| 10100010 | B0 | Trellis routine (black entry) |
| 10100011 | B0 | Trellis routine (black entry) |
| 10100100 | B0 | Trellis routine (black entry) |
| 10100101 | B0 | Trellis routine (black entry) |
| 10100110 | B0 | Trellis routine (black entry) |
| 10100111 | B0 | Trellis routine (black entry) |
| 10101000 | B0 | Trellis routine (black entry) |
| 10101001 | B0 | Trellis routine (black entry) |
| 10101010 | B0 | Trellis routine (black entry) |
| 10101011 | B0 | Trellis routine (black entry) |
| 10101100 | B0 | Trellis routine (black entry) |
| 10101101 | B0 | Trellis routine (black entry) |
| 10101110 | B0 | Trellis routine (black entry) |
| 10101111 | B0 | Trellis routine (black entry) |
| 10110000 | B0 | Trellis routine (black entry) |
| 10110001 | B0 | Trellis routine (black entry) |
| 10110010 | B0 | Trellis routine (black entry) |
| 10110011 | B0 | Trellis routine (black entry) |
| 10110100 | B0 | Trellis routine (black entry) |
| 10110101 | B0 | Trellis routine (black entry) |
| 10110110 | B0 | Trellis routine (black entry) |
| 10110111 | B0 | Trellis routine (black entry) |
| 10111000 | B0 | Trellis routine (black entry) |
| 10111001 | B0 | Trellis routine (black entry) |
| 10111010 | B0 | Trellis routine (black entry) |
| 10111011 | B0 | Trellis routine (black entry) |
| 10111100 | B0 | Trellis routine (black entry) |
| 10111101 | B0 | Trellis routine (black entry) |
| 10111110 | B0 | Trellis routine (black entry) |
| 10111111 | B10111111 | Routine to process '10111111' |
| 11000000 | B11000000 | Routine to process '11000000' |
| 11000001 | B11000001 | Routine to process '11000001' |
| 11000010 | B0 | Trellis routine (black entry) |
| 11000011 | B11000011 | Routine to process '11000011' |
| 11000100 | B0 | Trellis routine (black entry) |
| 11000101 | B0 | Trellis routine (black entry) |
| 11000110 | B0 | Trellis routine (black entry) |
| 11000111 | B11000111 | Routine to process '11000111' |
| 11001000 | B0 | Trellis routine (black entry) |
| 11001001 | B0 | Trellis routine (black entry) |
| 11001010 | B0 | Trellis routine (black entry) |
| 11001011 | B0 | Trellis routine (black entry) |
| 11001100 | B0 | Trellis routine (black entry) |
| 11001101 | B0 | Trellis routine (black entry) |
| 11001110 | B0 | Trellis routine (black entry) |
| 11001111 | B11001111 | Routine to process '11001111' |
| 11010000 | B0 | Trellis routine (black entry) |
| 11010001 | B0 | Trellis routine (black entry) |
| 11010010 | B0 | Trellis routine (black entry) |
| 11010011 | B0 | Trellis routine (black entry) |
| 11010100 | B0 | Trellis routine (black entry) |
| 11010101 | B0 | Trellis routine (black entry) |
| 11010110 | B0 | Trellis routine (black entry) |
| 11010111 | B0 | Trellis routine (black entry) |
| 11011000 | B0 | Trellis routine (black entry) |
| 11011001 | B0 | Trellis routine (black entry) |
| 11011010 | B0 | Trellis routine (black entry) |
| 11011011 | B0 | Trellis routine (black entry) |
| 11011100 | B0 | Trellis routine (black entry) |
| 11011101 | B0 | Trellis routine (black entry) |
| 11011110 | B0 | Trellis routine (black entry) |
| 11011111 | B11011111 | Routine to process '11011111' |
| 11100000 | B11100000 | Routine to process '11100000' |
| 11100001 | B11100001 | Routine to process '11100001' |
| 11100010 | B0 | Trellis routine (black entry) |
| 11100011 | B11100011 | Routine to process '11100011' |
| 11100100 | B0 | Trellis routine (black entry) |
| 11100101 | B0 | Trellis routine (black entry) |
| 11100110 | B0 | Trellis routine (black entry) |
| 11100111 | B11100111 | Routine to process '11100111' |
| 11101000 | B0 | Trellis routine (black entry) |
| 11101001 | B0 | Trellis routine (black entry) |
| 11101010 | B0 | Trellis routine (black entry) |
| 11101011 | B0 | Trellis routine (black entry) |
| 11101100 | B0 | Trellis routine (black entry) |
| 11101101 | B0 | Trellis routine (black entry) |
| 11101110 | B0 | Trellis routine (black entry) |
| 11101111 | B11101111 | Routine to process '11101111' |
| 11110000 | B11110000 | Routine to process '11110000' |
| 11110001 | B11110001 | Routine to process '11110001' |
| 11110010 | B0 | Trellis routine (black entry) |
| 11110011 | B11110011 | Routine to process '11110011' |
| 11110100 | B0 | Trellis routine (black entry) |
| 11110101 | B0 | Trellis routine (black entry) |
| 11110110 | B0 | Trellis routine (black entry) |
| 11110111 | B11110111 | Routine to process '11110111' |
| 11111000 | B11111000 | Routine to process '11111000' |
| 11111001 | B11111001 | Routine to process '11111001' |
| 11111010 | B0 | Trellis routine (black entry) |
| 11111011 | B11111011 | Routine to process '11111011' |
| 11111100 | B11111100 | Routine to process '11111100' |
| 11111101 | B11111101 | Routine to process '11111101' |
| 11111110 | B11111110 | Routine to process '11111110' |
| 11111111 | B11111111 | Routine to scan black bytes |

A fast way to process a byte is to simply code the sequence of operations required for that specific byte. For example, if CT is the current value of the run end counter, the byte whose binary value is '01111000' will cause the following actions to occur if the bit preceding it is a '1':

1. Save the value of CT in the run end buffer
2. Add 1 to CT (for first white bit)
3. Save the value of CT in the run end buffer
4. Add 4 to CT (for four black bits)
5. Save the value of CT in the run end buffer
6. Add 3 to CT (for three whites bits)

If the preceding bit is a zero, step 1 is omitted since the initial white bit is a continuation of a run from the previous byte. After the byte is processed, the next byte is used to index the table for bytes preceded by a white bit. This gives the address of the routine to be used to process the next byte.

Since a separate routine is used for each bit pattern, it is advantageous to choose one bit pattern which is expected to occur infrequently and use it to flag the right edge of the line of image data being converted. The first byte beyond the edge can be temporarily reset to have that value, so that it is not necessary to test for the end of the line on any other path. If it is possible for the line to end in the middle of a byte, the bits beyond the edge of the image in that byte can be set to '1' and the flag can be placed in the following byte. If this procedure is used and the line ends on a byte boundary, it is convenient to set the byte following the edge to all '1's and put the flag in the next byte. Thus when the right edge is reached it is guaranteed that a black run, some or all of whose bits are not part of the image, is being processed. The final entries in the run end buffer can then be set up as described in U.S. patent application Ser. No. 567,218. The preferred embodiment of the present invention uses the bit pattern '10101010' for the end-of-line flag. The block which processes this byte transfers control to the trellis routine (see FIG. 3) if the end of the line has not been reached; otherwise it causes a branch to the end-of-line processing.

Figure 2:
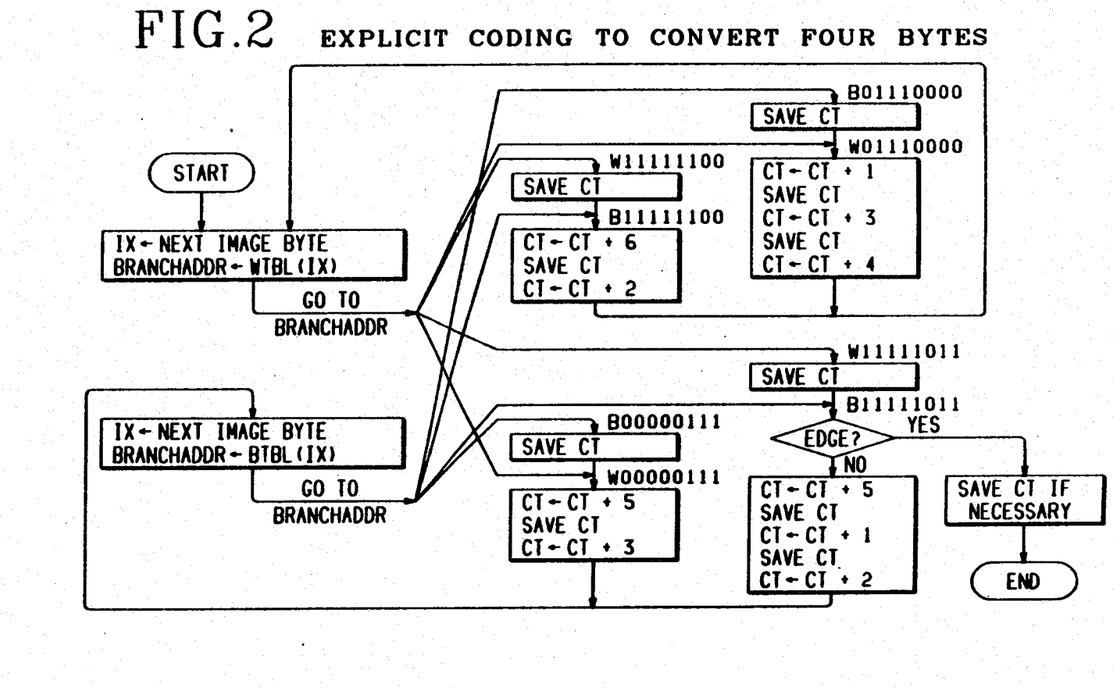
FIG. 2 is a flow diagram showing specific routines for conversion of selected image bytes having three or fewer runs.

As an example, suppose the image to be processed consisted only of bytes with one of the four binary values '00000111', '11111100', '01110000', and '11111011'. Assume that no trimming or padding is required, that the image lines are required to begin and end on byte boundaries, and that the pattern '11111011' has been chosen as the end-of-line flag. FIG. 2 shows a routine which would convert one line of such an image to run ends. Since the first run end in the output buffer must describe a white run, conversion begins as if the bit preceding the first byte was a zero. The first byte of image data is accordingly used to index into Table I WTBL of addresses for bytes preceded by a zero bit, and control passes to the resulting address. If the byte begins with a black bit, a new run is starting, so CT is saved in the run end buffer; otherwise it is not. CT is then incremented and saved as appropriate for the byte being processed. After the byte is processed, control returns to one of the two table lookup procedures: to Table I (using WTBL) if the last bit in the processed byte is white, or to Table II (BTBL, the table of addresses for bytes preceded by a black bit) if the last bit in the processed byte is black. Whenever the '11111011' pattern is encountered, a test is performed to see if the end of the line has been reached. If it has, then the last run end is stored if necessary and processing terminates; otherwise the bit pattern is processed in the same manner as the other patterns.

To allow lines of image data to begin off of byte boundaries (as often happens when clipping is required), the bits of the first byte which are not to be used are reset to copies of the first bit to be used before the byte is processed. It is also necessary to reduce CT and the limiting value for CT in the inner loop by the number of bits discarded (so that the extra bits in the first byte do not show up in the run end vector) before entering the loop.

The advantage of the explicit coding procedure described above is that it executes quickly on an IBM Personal Computer. The disadvantage is that to handle all 256 possible values of a byte (particularly values which contain several runs) requires a great deal of code space. However, by examining a group of "typical" facsimile images it becomes apparent that some byte values occur much more frequently than others. The 60 byte values containing one, two, or three runs account for over 98% of all bytes processed in many images. This embodiment of the present invention therefore arranges to handle that subset of possible byte values very efficiently, and provides a slightly less efficient routine requiring less code space to handle most other byte values. The choice of how many and which byte values to handle using the faster procedure may be varied depending on the distribution of byte values in the images to be converted (e.g. halftoned images generally contain many more bytes having more than three runs than images of text or line art) and on the amount of code space available.

Figure 3:
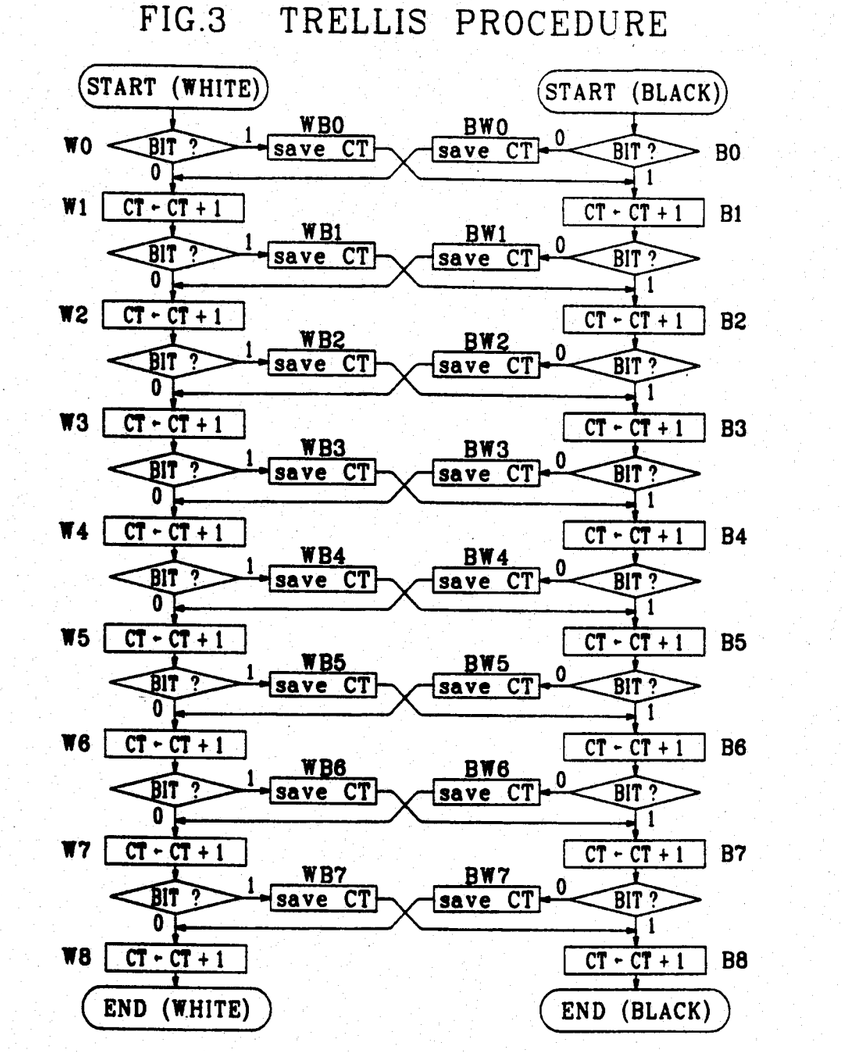
FIG. 3 is a flow diagram of a trellis routine for processing image bytes having four or more runs.

To process bytes which are not expected to occur frequently, a general routine is needed. The present method uses a "trellis" (see FIG. 3) which examines one bit at a time. There are many ways to test bits; a very efficient way on an IBM Personal Computer is to repeatedly shift the byte being examined left one bit and examine the carry flag after each shift. If the bit is the same as the previous bit, the process continues on to the next bit. If the bit is different, a branch occurs to a transitional state where CT is stored, and then the code to look for bits of the new color is branched to. After each bit is tested (and CT saved, if necessary), CT is incremented by one bit. The sequence of operations is shown in FIG. 3. Entry to this procedure occurs at one of the two points W0 or B0, depending on whether the last bit in the preceding image byte was white or black. If a state Wn is entered, the previous bit was white; similarly in a Bn state the previous bit was black. The W0 and B0 states test the first bit in the image byte (bit 0, numbering the image bits 0-7). In the Wn and Bn states for which n is 1, 2, 3, 4, 5, 6, or 7, CT is incremented by 1 for the previously tested bit and the nth bit is tested. If the tested bit is the same color as the previous bit, control passes to the next state of the same color, which increments CT and tests the next bit (if any). Otherwise a run end has been found and a transitional state is entered. The transitional states are those labeled "WBn" (white to black at bit n) and "BWn" (black to white at bit n). In these states CT is stored, and the state of the new color which will increment CT and test the next bit is entered. The W8 and B8 states increment CT for the eighth bit. After all of the bits have been tested, the next byte may be processed by using it to index into WTBL (if exit occurred from the white chain) or into BTBL (if exit occurred from the black chain).

In summary, each byte of image data is processed by using it to index into one of two lookup tables (depending on the value of the previous bit) to obtain the address of the code to be used to process the byte. This address may point to either a segment of code containing explicit instructions for handling that byte (used for bytes expected to occur frequently and for the end-of-line flag) or to one of the entry points of a routine which handles the bytes which are not expected to occur frequently. After each byte is processed, it is known (from the position in the code where processing stops) what color the last bit in the byte is, and hence which lookup table is to be used to process the next byte.

The following shows the flow of control in the inner block of the code which converts one line of image data to run end form. CT keeps track of the number of pels counted in the line so far; it is saved in the next available position in the run end buffer each time a run end is encountered. IMGPT points to the next byte of image data to be processed, and IX is a temporary variable used to index into the lookup tables WTBL and BTBL. Execution is initiated at the point labeled "LOOKUPW".

Those skilled in the art will recognize that there are several ways to make the code presented below execute more rapidly. For example, one could replicate the three lines of code at label "LOOKUPW" at each of the points where "goto LOOKUPW" is indicated, and similarly replicate the code at "LOOKUPB" at each point where a branch to that location is indicated. This would save one branch per byte processed through the table lookup procedures. One could also make use of the fast scanning instruction available on many processors to scan the fields of white and/or black bytes (calculating the value by which CT is to be incremented by multiplying the field length by 8).

```
B00000000:    save CT
W00000000:    CT = CT + 8
              (scan white bytes)
              while next byte = X'00'
              CT = CT + 8
              IMGPT = IMGPT + 1
              end
LOOKUPW:      IX = next byte
              IMGPT = IMGPT + 1
              goto (WTBL(IX))
W11111111:    save CT
B11111111:    CT = CT + 8
              (scan black bytes)
              while next byte = X'FF'
              CT = CT + 8
              IMGPT = IMGPT + 1
              end
LOOKUPB:      IX = next byte
              IMGPT = IMGPT + 1
              goto (BTBL(IX))
B00000001:    save CT
W00000001:    CT = CT + 7
              save CT
              CT = CT + 1
              goto LOOKUPB
B00000010:    save CT
W00000010:    CT = CT + 6
              save CT
              CT = CT + 1
              save CT
              CT = CT + 1
              goto LOOKUPW
B00000011:    save CT
W00000011:    CT = CT + 6
              save CT
              CT = CT + 2
              goto LOOKUPB
```

```
-continued
B00000100:    save CT
W00000100:    CT = CT + 5
              save CT
              CT = CT + 1
              save CT
              CT = CT + 2
              goto LOOKUPW
B00000110:    save CT
W00000110:    CT = CT + 5
              save CT
              CT = CT + 2
              save CT
              CT = CT + 1
              goto LOOKUPW
B00000111:    save CT
W00000111:    CT = CT + 5
              save CT
              CT = CT + 3
              goto LOOKUPB
B00001000:    save CT
W00001000:    CT = CT + 4
              save CT
              CT = CT + 1
              save CT
              CT = CT + 3
              goto LOOKUPW
B00001100:    save CT
W00001100:    CT = CT + 4
              save CT
              CT = CT + 2
              save CT
              CT = CT + 2
              goto LOOKUPW
B00001110:    save CT
W00001110:    CT = CT + 4
              save CT
              CT = CT + 3
              save CT
              CT = CT + 1
              goto LOOKUPW
B00001111:    save CT
W00001111:    CT = CT + 4
              save CT
              CT = CT + 4
              goto LOOKUPB
B00010000:    save CT
W00010000:    CT = CT + 3
              save CT
              CT = CT + 1
              save CT
              CT = CT + 4
              goto LOOKUPW
B00011000:    save CT
W00011000:    CT = CT + 3
              save CT
              CT = CT + 2
              save CT
              CT = CT + 3
              goto LOOKUPW
B00011100:    save CT
W00011100:    CT = CT + 3
              save CT
              CT = CT + 3
              save CT
              CT = CT + 2
              goto LOOKUPW
B00011110:    save CT
W00011110:    CT = CT + 3
              save CT
              CT = CT + 4
              save CT
              CT = CT + 1
              goto LOOKUPW
B00011111:    save CT
W00011111:    CT = CT + 3
              save CT
              CT = CT + 5
              goto LOOKUPB
B00100000:    save CT
W00100000:    CT = CT + 2
              save CT
              CT = CT + 1
```

|             |              |
|-------------|--------------|
|             | save CT |
|             | CT = CT + 5 |
|             | goto LOOKUPW |
| B00110000:  | save CT |
| W00110000:  | CT = CT + 2 |
|             | save CT |
|             | CT = CT + 2 |
|             | save CT |
|             | CT = CT + 4 |
|             | goto LOOKUPW |
| B00111000:  | save CT |
| W00111000:  | CT = CT + 2 |
|             | save CT |
|             | CT = CT + 3 |
|             | save CT |
|             | CT = CT + 3 |
|             | goto LOOKUPW |
| B00111100:  | save CT |
| W00111100:  | CT = CT + 2 |
|             | save CT |
|             | CT = CT + 4 |
|             | save CT |
|             | CT = CT + 2 |
|             | goto LOOKUPW |
| B00111110:  | save CT |
| W00111110:  | CT = CT + 2 |
|             | save CT |
|             | CT = CT + 5 |
|             | save CT |
|             | CT = CT + 1 |
|             | goto LOOKUPW |
| B00111111:  | save CT |
| W00111111:  | CT = CT + 2 |
|             | save CT |
|             | CT = CT + 6 |
|             | goto LOOKUPB |
| B01000000:  | save CT |
| W01000000:  | CT = CT + 1 |
|             | save CT |
|             | CT = CT + 1 |
|             | save CT |
|             | CT = CT + 6 |
|             | goto LOOKUPW |
| B01100000:  | save CT |
| W01100000:  | CT = CT + 1 |
|             | save CT |
|             | CT = CT + 2 |
|             | save CT |
|             | CT = CT + 5 |
|             | goto LOOKUPW |
| B01110000:  | save CT |
| W01110000:  | CT = CT + 1 |
|             | save CT |
|             | CT = CT + 3 |
|             | save CT |
|             | CT = CT + 4 |
|             | goto LOOKUPW |
| B01111000:  | save CT |
| W01111000:  | CT = CT + 1 |
|             | save CT |
|             | CT = CT + 4 |
|             | save CT |
|             | CT = CT + 3 |
|             | goto LOOKUPW |
| B01111100:  | save CT |
| W01111100:  | CT = CT + 1 |
|             | save CT |
|             | CT = CT + 5 |
|             | save CT |
|             | CT = CT + 2 |
|             | goto LOOKUPW |
| B01111110:  | save CT |
| W01111110:  | CT = CT + 1 |
|             | save CT |
|             | CT = CT + 6 |
|             | save CT |
|             | CT = CT + 1 |
|             | goto LOOKUPW |
| B01111111:  | save CT |
| W01111111:  | CT = CT + 1 |
|             | CT = CT + 7 |

|             |              |
|-------------|--------------|
|             | goto LOOKUPB |
| W10000000:  | save CT |
| B10000000:  | CT = CT + 1 |
|             | save CT |
|             | CT = CT + 7 |
|             | goto LOOKUPW |
| W10000001:  | save CT |
| B10000001:  | CT = CT + 1 |
|             | save CT |
|             | CT = CT + 6 |
|             | save CT |
|             | CT = CT + 1 |
|             | goto LOOKUPB |
| W10000011:  | save CT |
| B10000011:  | CT = CT + 1 |
|             | save CT |
|             | CT = CT + 5 |
|             | save CT |
|             | CT = CT + 2 |
|             | goto LOOKUPB |
| W10000111:  | save CT |
| B10000111:  | CT = CT + 1 |
|             | save CT |
|             | CT = CT + 4 |
|             | save CT |
|             | CT = CT + 3 |
|             | goto LOOKUPB |
| W10001111:  | save CT |
| B10001111:  | CT = CT + 1 |
|             | save CT |
|             | CT = CT + 3 |
|             | save CT |
|             | CT = CT + 4 |
|             | goto LOOKUPB |
| W10011111:  | save CT |
| B10011111:  | CT = CT + 1 |
|             | save CT |
|             | CT = CT + 2 |
|             | save CT |
|             | CT = CT + 5 |
|             | goto LOOKUPB |
| W10111111:  | save CT |
| B10111111:  | CT = CT + 1 |
|             | save CT |
|             | CT = CT + 1 |
|             | save CT |
|             | CT = CT + 6 |
|             | goto LOOKUPB |
| W11000000:  | save CT |
| B11000000:  | CT = CT + 2 |
|             | save CT |
|             | CT = CT + 6 |
|             | goto LOOKUPW |
| W11000001:  | save CT |
| B11000001:  | CT = CT + 2 |
|             | save CT |
|             | CT = CT + 5 |
|             | save CT |
|             | CT = CT + 1 |
|             | goto LOOKUPB |
| W11000011:  | save CT |
| B11000011:  | CT = CT + 2 |
|             | save CT |
|             | CT = CT + 4 |
|             | save CT |
|             | CT = CT + 2 |
|             | goto LOOKUPB |
| W11000111:  | save CT |
| B11000111:  | CT = CT + 2 |
|             | save CT |
|             | CT = CT + 3 |
|             | save CT |
|             | CT = CT + 3 |
|             | goto LOOKUPB |
| W11001111:  | save CT |
| B11001111:  | CT = CT + 2 |
|             | save CT |
|             | CT = CT + 2 |
|             | save CT |
|             | CT = CT + 4 |
|             | goto LOOKUPB |
| W11011111:  | save CT |

| | -continued | | | -continued |
|---|---|---|---|---|
| B11011111: | CT = CT + 2 | | | CT = CT + 2 |
| | save CT | | | goto LOOKUPB |
| | CT = CT + 1 | | W11111100: | save CT |
| | save CT | | B11111100: | CT = CT + 6 |
| | CT = CT + 5 | | | save CT |
| | goto LOOKUPB | | | CT = CT + 2 |
| W11100000: | save CT | | | goto LOOKUPW |
| B11100000: | CT = CT + 3 | | W11111101: | save CT |
| | save CT | | B11111101: | CT = CT + 6 |
| | CT = CT + 5 | | | save CT |
| | goto LOOKUPW | | | CT = CT + 1 |
| W11100001: | save CT | | | save CT |
| B11100001: | CT = CT + 3 | | | CT = CT + 1 |
| | save CT | | | goto LOOKUPB |
| | CT = CT + 4 | | W11111110: | save CT |
| | save CT | | B11111110: | CT = CT + 7 |
| | CT = CT + 1 | | | save CT |
| | goto LOOKUPB | | | CT = CT + 1 |
| W11100011: | save CT | | | goto LOOKUPW |
| B11100011: | CT = CT + 3 | | B10101010: | if end of line reached, leave converter |
| | save CT | | | otherwise goto B0 |
| | CT = CT + 3 | | | (Trellis code) |
| | save CT | | B0: | if next bit is 0, goto BW0 |
| | CT = CT + 2 | | B1: | CT = CT + 1 |
| | goto LOOKUPB | | | if next bit is 0, goto BW1 |
| W11100111: | save CT | | B2: | CT = CT + 1 |
| B11100111: | CT = CT + 3 | | | if next bit is 0, goto BW2 |
| | save CT | | B3: | CT = CT + 1 |
| | CT = CT + 2 | | | if next bit is 0, goto BW3 |
| | save CT | | B4: | CT = CT + 1 |
| | CT = CT + 3 | | | if next bit is 0, goto BW4 |
| | goto LOOKUPB | | B5: | CT = CT + 1 |
| W11101111: | save CT | | | if next bit is 0, goto BW5 |
| B11101111: | CT = CT + 3 | | B6: | CT = CT + 1 |
| | save CT | | | if next bit is 0, goto BW6 |
| | CT = CT + 1 | | B7: | CT = CT + 1 |
| | save CT | | | if next bit is 0, goto BW7 |
| | CT = CT + 4 | | B8: | CT = CT + 1 |
| | goto LOOKUPB | | | got LOOKUPB |
| W11110000: | save CT | | W0: | if next bit is 1, goto WB0 |
| B11110000: | CT = CT + 4 | | W1: | CT = CT + 1 |
| | save CT | | | if next bit is 1, goto WB1 |
| | CT = CT + 4 | | W2: | CT = CT + 1 |
| | goto LOOKUPW | | | if next bit is 1, goto WB2 |
| W11110001: | save CT | | W3: | CT = CT + 1 |
| B11110001: | CT = CT + 4 | | | if next bit is 1, goto WB3 |
| | save CT | | W4: | CT = CT + 1 |
| | CT = CT + 3 | | | if next bit is 1, goto WB4 |
| | save CT | | W5: | CT = CT + 1 |
| | CT = CT + 1 | | | if next bit is 1, goto WB5 |
| | goto LOOKUPB | | W6: | CT = CT + 1 |
| W11110011: | save CT | | | if next bit is 1, goto WB6 |
| B11110011: | CT = CT + 4 | | W7: | CT = CT + 1 |
| | save CT | | | if next bit is 1, goto WB7 |
| | CT = CT + 2 | | W8: | CT = CT + 1 |
| | save CT | | | goto LOOKUPW |
| | CT = CT + 2 | | BW0: | save CT |
| | goto LOOKUPB | | | goto W1 |
| W11110111: | save CT | | BW1: | save CT |
| B11110111: | CT = CT + 4 | | | goto W2 |
| | save CT | | BW2: | save CT |
| | CT = CT + 1 | | | goto W3 |
| | save CT | | BW3: | save CT |
| | CT = CT + 3 | | | goto W4 |
| | goto LOOKUPB | | BW4: | save CT |
| W11111000: | save CT | | | goto W5 |
| B11111000: | CT = CT + 5 | | BW5: | save CT |
| | save CT | | | goto W6 |
| | CT = CT + 3 | | BW6: | save CT |
| | goto LOOKUPW | | | goto W7 |
| W11111001: | save CT | | BW7: | save CT |
| B11111001: | CT = CT + 5 | | | goto W8 |
| | save CT | | WB0: | save CT |
| | CT = CT + 2 | | | goto B1 |
| | save CT | | WB1: | save CT |
| | CT = CT + 1 | | | goto B2 |
| | goto LOOKUPB | | WB2: | save CT |
| W11111011: | save CT | | | goto B3 |
| B11111011: | CT = CT + 5 | | WB3: | save CT |
| | save CT | | | goto B4 |
| | CT = CT + 1 | | WB4: | save CT |
| | save CT | | | |

```
             goto B5
WB5:         save CT
             goto B6
WB6:         save CT
             goto B7
WB7:         save CT
             goto B8
```

The trellis routine of FIG. 3 may also be used in an alternate embodiment to convert 3 bytes (24 bits) of binary data to 10 bytes of grayscale, i.e. each 2.4 bits determines the value of one byte. The original bytes are put through a double chain similar to the trellis shown in FIG. 3. In this case, there is no CT saved when going from one chain to another. The output bytes byte 1, byte 2, . . . , byte 10 are set to zero before the chain is entered. The white chain tests bits and goes into the black chain at the appropriate place when a black bit is found. The black chain adds an appropriate value to one or two of the output bytes for each black bit, e.g.

```
B0:    test bit; go to white chain if white
       byte1=byte1+N
B1:    test bit; go to white chain if white
       byte1=byte1+N
B2:    test bit; go to white chain if white
       byte1=byte1+.4*N
       byte2=byte2+.6*N
B3:    test bit; go to white chain if white
       byte2=byte2+N
B4:    test bit; go to white chain if white
       byte2=byte2+.8*N
       byte3=byte3+.2*N
etc.
```

There would be 24 stages in the chain (since 24 bits are being processed at a time). At the end, each output byte byte 1, byte 2, . . . , byte 10 could have at most the value 2.4*N, so the choice of N determines the range of output byte values. The entry point would not depend on the color value of the previous bit in this case.

Note that this trellis procedure for converting bits into grayscale could also be incorporated into an hybrid algorithm similar to the preferred embodiment of the present invention. Such an algorithm could incorporate features such as the skipping of all-white (zero) areas of the image and/or table lookup of some of the grayscale values.

Thus, while the invention has been described with reference to preferred embodiments thereof, it will be understood by those skilled in the art that various changes in form and details may be made without departing from the scope of the invention.

What is claimed is:

1. A computerized method for converting an image stored as a bit map in binary form to a run representation form, said bit map having a plurality of lines, said method comprising the steps of:
   (a) segmenting a first of said lines of said bit map into units of equal numbers of bits for use as lookup table indices;
   (b) creating a lookup table which contains, for each possible unit used as an index value, the address of a conversion routine which converts said unit to run representation form;
   (c) converting said first line of said image to run representation form by the steps of:
      (1) using a first unit of said lines as an index into said lookup table to access the conversion routine corresponding to such unit;
      (2) selecting a conversion routine according to said lookup table contents;
      (3) executing the selected conversion routine to convert said unit to run representation form;
      (4) storing any resulting run representations in a run representation buffer, as a count value; and
      (5) repeating said steps (1), (2), (3) and (4) for successive units until all of the units in said first line have been stored in run representation form in said run representation buffer; and
   (d) repeating the steps of segmenting and converting for successive lines to the end of the image.

2. A method according to claim 1 wherein the step of creating a lookup table comprises creating first and second lookup tables which contain, for each possible unit used as an index value, the address of a routine which converts said unit to run representation form given that the last image bit in the previously converted unit was of a first or second binary value, respectively.

3. A method according to claim 2 wherein the step of repeating for successive units in a line further includes:
   indexing said first lookup table with a successive unit if the preceding image bit has a first binary value; and indexing said second lookup table with a successive unit if the preceding image bit has a secondary binary value.

4. A method according to claim 1 further comprising the steps of:
   accessing a trellis routine for a preselected subset of units; and
   executing a bit by bit conversion on said preselected subset to convert its units from bit string to run representation form.

5. A method according to claim 4, further including the step of:
   inputting a successive unit to a first starting point in said trellis routine if a last image bit in the preceding unit has a first binary value; and
   inputting a successive unit to a second tarting point in said trellis routine if a last image bit in the preceding unit has a second binary value.

6. Apparatus for converting an image stored as a bit map in binary form to a run representation form, said bit map having a plurality of lines, said apparatus comprising:
   (a) means for segmenting a first of said lines of said bit map into units of equal numbers of bits for use as lookup table indices;
   (b) lookup table means for containing, for each possible unit used as an index value, the address of a conversion routine which converts said unit to run representation form;
   (c) means for converting the first line of said image to run representation form comprising:
      (1) indexing means for successively using each unit as an index into said lookup table means to access the respective conversion routine corresponding to each unit;
      (2) selection means for selecting a conversion routine according to said lookup table contents;
      (3) means for executing the selected respective conversion routines to convert said units to run representations;
      (4) run representation buffer means for storing each run representation as a count value; and means for activating said indexing means and said executing means until all of said units in said first line have been stored in run representation form in said run representation buffer means; and (d) means for activating said segmenting and converting means to operate on successive lines to the end of the image, whereby said image is stored in run representation form.

7. Apparatus according to claim 6 wherein said lookup table means comprises a first and a second lookup table; and said indexing means further comprises:

means for indexing said first lookup table with a successive unit if the preceding image bit has a first binary value; and means for indexing said second lookup table with a successive unit if the preceding image bit has a second binary value.

8. Apparatus according to claim 6 further comprising:

means for accessing a trellis routine for a preselected subset of units; and means for executing a bit by bit conversion on said preselected subset to convert its units from bit string to run representation.

9. Apparatus according to claim 8 further comprising:

means for inputting a successive unit to a first starting point in said trellis routine if a last image bit in the preceding unit has first binary value; and means for inputting a successive unit to a second starting point in said trellis routine if a last image bit in the preceding unit has a second binary value.

10. A computerized method for converting an image stored as a bit map in binary form to a run representation form, said bit map having a plurality of lines, said method comprising the steps of:

(a) segmenting a first of said lines of said bit map into units of equal numbers of bits for use in indexing lookup tables;

(b) creating first and second lookup tables that contain, for each possible unit used as an index value, the address of a conversion routine which converts said unit to run representation form;

(c) converting the first line of said image to run representation form by the steps of:

(1) using a first unit of said line as an index into said first lookup table to access the conversion routine corresponding to such unit;

(2) selecting a conversion routine according to said lookup table contents;

(3) executing the selected conversion routine to convert said first unit to run representation form;

(4) using the next unit of said line as an index to said first lookup table if the preceding image bit has a first binary value, or indexing it to said second lookup table if the preceding image bit has a second binary value, to access the conversion routine corresponding to said next unit;

(5) executing the selected conversion routine to convert said next unit to run representation form;

(6) storing each resulting run representation in a run representation buffer, as a count value; and (7) repeating said steps (4), (5) and (6) for successive units until all of the units in said first line have been stored in run representation form in said run representation buffer; and (d) repeating the steps of line segmenting and converting for successive lines to the end of the image.

* * * * *